United States Patent [19]

Akahoshi et al.

[11] Patent Number: 4,632,852
[45] Date of Patent: Dec. 30, 1986

[54] PROCESS FOR ELECTROLESS COPPER PLATING

[75] Inventors: Haruo Akahoshi, Hitachi; Kanji Murakami, Mito; Mineo Kawamoto; Motoyo Wajima, both of Hitachi; Rituji Toba, Hadano; Shoji Kawakubo, Ibaraki; Akio Tadokoro, Hitachi, all of Japan

[73] Assignee: Hitachi, Ltd., Tokyo, Japan

[21] Appl. No.: 746,099

[22] Filed: Jun. 18, 1985

[30] Foreign Application Priority Data

Jun. 18, 1984 [JP] Japan .................................. 59-123657
Jun. 22, 1984 [JP] Japan .................................. 59-127475

[51] Int. Cl.$^4$ ............................................. C23C 3/02
[52] U.S. Cl. .................................. 427/437; 106/1.23; 106/1.26; 427/443.1
[58] Field of Search ........................... 106/1.23, 1.26; 427/437, 443.1

[56] References Cited

U.S. PATENT DOCUMENTS

| | | | |
|---|---|---|---|
| 2,938,805 | 5/1960 | Agens | 106/1.26 |
| 3,915,717 | 10/1975 | Feldstein et al. | 106/1.26 |
| 4,152,467 | 5/1979 | Alpaugh et al. | 106/1.26 |

Primary Examiner—Lorenzo B. Hayes
Attorney, Agent, or Firm—Antonelli, Terry & Wands

[57] ABSTRACT

In a process for electroless copper plating in an electroless copper plating solution containing a copper salt, a complexing agent for the copper salt, a reducing agent for the copper salt, and a pH-adjusting agent, a plating film having distinguished mechanical properties can be obtained by adding at least one of soluble inorganic silicon compounds and soluble inorganic germanium compounds and conducting the electroless copper plating by injecting an oxygen-containing gas into the plating solution or by adding an oxidizing agent to the plating solution or by both injection or the oxygen-containing gas and addition of the oxidizing agent thereto. The stability of the electroless copper plating solution can be maintained better thereby and substantially thick plating is possible.

31 Claims, No Drawings

PROCESS FOR ELECTROLESS COPPER PLATING

BACKGROUND OF THE INVENTION

This invention relates to a process for electroless copper plating which can form a copper plating film having distinguished mechanical properties, and particularly to a process for electroless copper plating suitable for thick plating in the production of printed circuit boards.

However, a process for electroless copper plating to deposit metallic copper by adding a copper ion-reducing agent such as formaldehyde, etc. to a solution containing copper ions and its complexing agent has been known. However, the electroless copper plating solution consisting only of such basic components is unstable and liable to undergo self-decomposition reaction. Thus, it has been difficult to carry out the electroless copper plating for a long time.

Japanese Patent Publication No. 43-12966 discloses addition of a sulfur compound such as thiourea, 2-mercaptobenzothiazole, etc. thereto to improve the stability of the plating solution. However, even if the resulting plating solution containing the additive sulfur compound is applied to a process for producing printed circuit boards according to the so called additive process which forms a conductor circuit for the printed circuit board or plating throughholes by electroless copper plating, the mechanical properties of the resulting plating films are not satisfactory, and novel additives to an electroless copper plating solution which can form a plating film having better mechanical properties have been desired.

Furthermore, an electroless copper plating solution capable of producing a plating film of distinguished mechanical properties is necessary for printed circuit boards for throughhole interconnections by thick plating, and an electroless copper plating solutions containing a further additive such as a cyano compound, 2,2'-dipyridyl, polyethylene glycol, etc. besides said basic components are known. However, these additives have problems in handling and are consumed during the plating. Thus, their analysis and make-up are necessary from time to time during the plating.

Furthermore, a process for improving mechanical properties of a copper plating film by electroless copper plating with an electroless copper plating solution containing said basic components 2,2'-dipyridyl, polyethylene glycol and an alkali-soluble inorganic silicon compound is disclosed [Japanese Patent Application Kokai (Laid-open) No. 54-19430], where it is stated that the resulting electroless copper plating film having a tensile strength of 50 to 58 kg f/mm$^2$ and an elongation of 4.4 to 6.7% can be obtained when 5–100 mg/l of the alkali-soluble inorganic silicon compound in terms of silicon dioxide (0.08 to 1.7 m moles/l in terms of Si) is contained in the electroless copper plating solution. However, the stability of the plating solution is not good and there takes place abnormal deposition (a phenomenon of depositing copper on outside of desired portions) when the plating solution is used continuously for a little prolonged time.

It has been so far known to add an inorganic silicon compound such as water glass, sodium metasilicate, and sodium orthosilicate to the electroless copper plating solution, but the resulting electroless copper plating solution is not satisfactory in the stability. For example, the plating solution becomes unstable in the course of plating when applied to thick electroless copper plating, and a plating film having a satisfactory thickness cannot be substantially obtained. This is obvious from the disclosure in "Kinzoku Hyomen-Gizitsu (Metal Surface Technology) Vol. 16, November issue (1965) that the inorganic silicate compound is effective for preventing the self-decomposition of the electroless copper plating solution, but copper deposits at the bottom of the plating tank. Furthermore, the plating film obtained from the electroless copper plating solution as described in said reference is brittle and has no satisfactory mechanical characteristics upon measurement of the physical properties of the plating film. That is, as shown in Tables 5 and 6 which follow, it has been found that mere addition of an inorganic silicon compound to the electroless copper plating solution causes copper deposition in the plating tank. Furthermore, it has been found that the plating solution undergoes self-decomposition during the plating, depending on the species of complexing agents, and the mechanical properties of the plating film obtained from such a plating solution are not better in general.

On the other hand, it is disclosed in Japanese Patent Publication No. 36-9063 to inject an oxygen-containing gas, for example, air, into an electroless copper plating solution with an effect on the stabilization of the plating solution. However, mere injection of oxygen-containing gas cannot remarkable improve the mechanical properties of the plating film. That is, as shown in Tables 5 and 6 which follow, it has been found that the self-decomposition of the plating solution can be suppressed and the stability of the plating solution can be improved to some degree by injection of air into the plating solution, but the mechanical properties of the plating films obtained by mere injection of air into the plating solution are not improved. That is, mere injection of oxygen-containing gas cannot produce satisfactorily distinguished mechanical properties.

SUMMARY OF THE INVENTION

An object of the present invention is to provide a process for electroless copper plating with easy plating solution control which can form a plating film having distinguished mechanical properties.

The present invention provides a process for electroless copper plating, using an electroless copper plating solution comprising a copper salt, a complexing agent for the copper salt, a reducing agent for the copper salt, and a pH-adjusting agent, characterized in that at least one of soluble inorganic silicon compounds and soluble inorganic germanium compounds is added as an additive to the electroless copper plating solution, and electroless copper plating is carried out by injecting an oxygen-containin,g gas into the electroless copper plating solution or by adding an oxidizing agent such as hydrogen peroxide, a persulfate, etc. or by both injection of the oxygen-containing gas and addition of the oxidizing agent.

The present invention is based on a finding that a synergistic effect can be obtained on remarkable improvement of mechanical properties of a plating film by adding at least one of soluble inorganic silicon compounds and soluble inorganic germanium compounds to an electroless copper plating solution and by carrying out electroless copper plating by introducing an oxidizing medium into the plating solution, i.e. by injecting an oxygen-containing gas into the electroless copper plating solution or by adding an oxidizing agent to the electroless copper plating solution, or by both injection of the oxygen-containing gas and addition of the oxidizing agent thereto.

That is, as a result of extensive studies, the present inventors have found that the mechanical properties of a plating film can be remarkably improved by adding a soluble inorganic silicon compound to an electroless copper plating solution and by carrying out electroless copper plating while injecting air into the electroless copper plating solution, as shown in Tables 1 and 2 which follow. It has been found that this effect can be obtained even by injection of air at a relatively small rate, but the mechanical properties of the resulting plating film are more improved with increasing rate of the injected air, and a plating film having substantially constant mechanical properties can be stably obtained at a rate of injected air of at least 0.01 /min. per liter of the plating solution. Furthermore, it has been found that the stability of the electroless copper plating solution can be considerably improved by simultaneous addition of a soluble inorganic silicon compound and injection of an oxygen-containing gas to the electroless copper plating solution.

As to the stability of the electroless copper plating solution, the stability is more improved with increasing rate of injected oxygen-containing gas, slightly different from the mechanical properties of the plating film, but an excessively high rate of injected oxygen-containing gas may bring about such problems as scattering of the plating solution or stirring of workpieces, or concentration and reduction in volume of the plating solution by evaporation of water or decrease in the plating temperature. Thus, injection of oxygen-containing gas at an excessively high rate is not desirable. As shown in Tables 1 and 2 which follow, a satisfactory stability of the electroless plating solution can be obtained by injection of air at a rate of 1 to 5 /min per liter of the plating solution, though dependent on the composition of the plating solution, and the plating film thus obtained has a much distinguished level of mechanical properties.

It has been also found that the effect on improvement of the mechanical properties by injection of air depends on the oxygen contained in the air. Thus, it is possible to obtain an equivalent effect by injection of other oxygen-containing gas, for example, a mixture of oxygen with an inert gas such as argon, nitrogen, etc. in an appropriate ratio. The necessary rate of injected oxygen-containing gas depends on the mixing ratio of oxygen gas.

Furthermore, it has been found that by adding an oxidizing agent to the electroless copper plating solution in place of the injection of the oxygen-containing gas, a plating film having distinguished mechanical properties can be stably formed likewise.

Furthermore, as a result of extensive studies, the present inventors have found that a soluble inorganic germanium compound also has an equivalent effect to that of the inorganic silicon compound. As shown in Tables 5 and 6 which follow, an electroless copper plating film obtained by electroless copper plating by adding a soluble inorganic germanium compound thereto while injecting air thereto has much distinguished mechanical properties, and better effects than those of the soluble inorganic silicon compound can be obtained on the stability of the plating solution and the mechanical properties of the plating film. In the case of the soluble inorganic germanium compound, a better effect can be obtained by addition of a smaller amount of the germanium compound, as compared with the case of the soluble inorganic silicon compound.

The soluble inorganic silicon compound for use in the present invention includes water glass, metasilicates such as sodium metasilicate, orthosilicates such as sodium orthosilicate, silicates such as sodium silicate, potassium silicate, lithium silicate, etc., polysilicates such as sodium polysilicate, silicon dioxide, a silicon-containing gas, etc. They can be used alone or in a mixture thereof.

The soluble inorganic germanium compound for use in the present invention includes water-soluble inorganic salts and oxides, such as sodium germanate, potassium germanate, lithium germanate etc., and germanium dioxide. Germanium dioxide as the oxide form of the inorganic germanium compound can attain the object of the present invention, even if it is directly dissolved in the electroless copper plating solution. In addition, such salts as germanium chloride, germanium sulfate, germanium nitrate, etc. can attain the equivalent effect. They can be used alone or in a mixture thereof.

The effective amount of the additive for improving the mechanical properties of the plating film is at least 10 mg/l of a soluble inorganic silicon compound in terms of silicon atom and at least 10 mg/l of a soluble inorganic germanium compound in terms of germanium atom, and no remarkable effect is expectable below 10 mg/l thereof. To improve only the stability of the electroless copper plating solution, the stability can be improved to some degree even below 10 mg/l thereof by considerably increasing the rate of injected air, but the mechanical properties of the resulting plating film cannot be improved below 10 mg/l of the soluble inorganic silicon compound or soluble inorganic germanium compound in terms of silicon atom or germanium atom even by increasing the rate of injected air. The upper limit to the amount of the additive is not particularly restricted for attaining the object of the present invention, but when the viscosity of the electroless copper plating solution becomes higher by too much addition of a highly concentrated sodium silicate solution known as water glass (for example, 300 g/l or more in terms of sodium metasilicate), the handing of the plating solution becomes difficult, and the solution cannot be substantially used as an electroless copper plating solution.

To improve the mechanical properties of the plating film as desired in the present invention, a practically satisfactory effect can be obtained when not more than 1 g/l of the additive in terms of silicon atom or germanium atom is added to the electroless copper plating solution. According to the studies made by the present inventors, no more remarkable effect can be obtained above 1 g/l. For example, even if the amount of the additive is largely increased, the mechanical properties of the plating flim cannot be greatly improved unless the injection of the oxygen-containing gas or the addition of the oxidizing agent is carried out.

According to further study made by the present inventors, the plating speed tends to gradually decrease with increasing amount of the soluble inorganic silicon compound or the soluble inorganic germanium compound. The decrease in the plating speed is not economically preferable in the case of commercial application, and the amount of the additive should be selected in view of the desired purpose and the balance between the amount and the effect. When the electroless copper plating process is applied to the plating for the ordinary purpose, for example, plating of printed circuit boards, no advantage can be obtained above 1 g/l of the additive, unless there is a special requirement.

There is no substantial problem in handling of the soluble inorganic silicon compound and soluble inorganic germanium compound for use in the present invention, or in BOD or COD. The soluble inorganic silicon compound and the soluble inorganic germanium compound are not substantially consumed during the plating, and are also cheap. This is a commercially large advantage.

In the present invention, air is usually used as the oxygen-containing gas, and the stability of the electroless copper plating solution can be kept by injection of the air. Pure oxygen can be naturally used as the oxygen-containing gas. The oxidizing agent for use in the present invention includes hydrogen peroxide and persulfates such as potassium persulfate, sodium persulfate, ammonium persulfate, etc. The amount of the oxidizing agent is at least about 0.5 g/l, though dependent on the species of the oxidizing agent. Below about 0.5 g/l, the stability of the electroless copper plating solution cannot be thoroughly maintained, and the substantially thick plating cannot be carried out. Hydrogen peroxide and persulfates can be handled with ease and have no substantial problem in BOD or COD.

In the present invention, a preferable plating temperature is 40° C. or higher. Below 40° C., no plating film having satisfactorily good mechanical properties can be obtained.

The electroless copper plating solution for use in the present invention comprises a copper salt, a complexing agent for the copper salt, a reducing agent for the copper salt, and a pH-adjusting agent as basic components. Known soluble copper salt such as copper sulfate, cupric chloride, copper acetate, copper formate, etc. can be used as the copper salt. If necessary, copper hydroxide, etc. can be used. It is also possible to provide copper ions by chemical or electrochemical dissolution of metallic copper.

The complexing agent for the copper salt is preferably compounds having a skeleton of $>$N—C—C—N$<$, including, for example, ethylenediaminetetracetic acid, N-hydroxyethylethylenediaminetriacetic acid, 1,2-diaminopropanetetracetic acid, diethylenetriaminepentacetic acid, cyclohexanediaminetetracetic acid, etc. When monoamines such as triethanolamine, iminodiacetic acid, iminotriacetic acid, etc. or Rochelle salts are used, there are such problems that plating films having satisfactory mechanical properties may not be obtained or the stability of the electroless copper plating film is not satisfactory and the substantially thick plating film may not be obtained.

A suitable reducing agent for the copper salt is formalin as usually used, and a suitable pH-adjusting agent is sodium hydroxide as usually used.

One of suitable applicable fields of the present invention is a process for producing printed circuit boards. When the present invention is applied to throughhole plating of two-side printed circuit plates or multi-layer printed circuit boards, throughhole connection can be obtained with a high reliability. When the present invention is applied to circuit formation of printed circuit boards according to the additive process, a better result can be likewise obtained. This is due to the effect of the copper plating film having distinguished mechanical properties obtained according to the present invention. Furthermore, the present invention can be also applied to metallizing of a resin surface, where a copper film free from cracks due to abrupt expansion or contraction of a substrate by a thermal shock can be formed on the resin surface by virtue of the distinguished mechanical properties of the copper plating film produced according to the present invention.

For example, throughhole plating of printed circuit board is carried out according to the present invention in the following manner:

(1) Copper foil surfaces of a two-side copper-clad laminate board are cleaned. Then, holes are provided through the laminate board at necessary locations.

(2) With commercially available catalyst solution for the electroless plating, the hole inside walls and the copper foil surfaces are sensitized for the electroless copper plating.

(3) Electroless copper plating is carried out on the copper foil surfaces and the hole inside walls according to the present invention. The thickness of copper plating film depends on the desired purpose, but usually is 10 to 40 μm.

Specifically, an electroless plating solution consisting of the components shown in Tables 1 and 3 which follow, is prepared, and after adding of the oxidizing agent thereto, or while injecting an oxygen-containing gas, for example, air into the plating solution, the plating solution is kept at the predetermined plating temperature. Then, the copper-clad laminate board sensitized in said step (2) is dipped into the electroless copper plating solution until the desired thickness of the plating film is obtained. When the plating is continued for a long time, the concentrations of the consumable components by plating are desirably kept constant. To this end, analysis of the components and make-up of consumed components are preferably made from time to time.

(4) After the completion of plating, the copper-clad laminate board is washed with water, and the necessary parts on the copper surfaces are masked with an etching resist, and the unwanted parts are removed by etching. After the etching, the etching resist is removed therefrom, whereby the two-side printed circuit board with the wiring circuit and throughhole interconnections thereon can be obtained.

The thus obtained printed circuit board has throughhole connections having a very high reliability, as compared with the printed circuit boards prepared according to the conventional process for electroless copper plating.

Application of the present invention to the full additive process will be described below.

(1) An adhesive layer is provided on the surface of an insulating substrate such as a paper-phenol resin laminate board, a paper-epoxy resin laminate board, a glass-epoxy resin laminate board, etc., and holes are provided through the substrate.

(2) After the adhesive surface is chemically roughened, the substrate is treated with a commercially available catalyst solution for electroless copper plating solution to sensitize the roughened surface and the hole inside walls to the electroless copper plating.

(3) Other parts than the part for forming a circuit on the adhesive surface are masked with a plating resist.

(4) Electroless copper plating and the after-treatment are carried out according to the present invention in the same manner as described above.

The thus prepared printed circuit board has a very high reliability, as compared with the printed circuit boards prepared according to the conventional process for electroless copper plating.

PREFERRED EMBODIMENT OF THE INVENTION

The present invention will be described in detail below, referring to Examples.

As described above, the main applications of an electroless copper plating are plating on printed circuit boards and metallizing of the insulating substrate surface. However, in these applications, treatment for promoting tight adhesion is carried out, and it is difficult to evaluate the mechanical properties simply by peeling off the copper plating film therefrom. Thus, in the following examples, electroless copper plating was carried out on stainless steel plates, and mechanical properties were investigated by peeling off the plating film therefrom. This procedure is usually carried out for evaluating the mechanical properties of plating film.

EXAMPLES 1 TO 39

Stainless steel plates, whose surfaces were smoothly polished, were defatted and tin-palladium catalyst as a starter for electroless copper plating reaction was deposited on the surfaces. The plates were then subjected to electroless copper plating in electroless copper plating solutions having compositions under plating conditions shown in Tables 1 and 3 to obtain plating films having a thickness of about 30 μm. The plating films were peeled off from the stainless steel plates and cut to test pieces, 10 mm wide. Test pieces were subjected to measurement of elongation and tensile strength up to breaking by a tension testing machine made by Toyo Sokki K.K. Japan with an initial draw distance of 50 mm. The results are shown in Tables 2 and 4.

COMPARATIVE EXAMPLES 1 TO 19

Electroless copper plating was carried out under conditions given in Table 5 and in the same manner as in Examples 1-39, and evaluated. The results are given in Table 6.

EXAMPLE 40

Throughhole plating of printed circuit boards was carried out to a plating thickness of 30 μm according to the present process for electroless copper plating under the conditions given in Tables 1 and 3. The reliability of throughhole connections of the printed circuit boards thus prepared was on a much higher level than that of the printed circuit boards prepared according to the process for electroless copper plating under the conditions given in Table 5, and was satisfactory for printed circuit boards for use in electronic appliances requiring a strict reliability.

TABLE 1

| Composition of electroless copper plating solution and plating conditions | Example No. | | | | | | | | | | | | |
|---|---|---|---|---|---|---|---|---|---|---|---|---|---|
| | 1 | 2 | 3 | 4 | 5 | 6 | 7 | 8 | 9 | 10 | 11 | 12 | 13 |
| $CuSO_4 \cdot 5H_2O$ (g) | 10 | 10 | 10 | 10 | 10 | 10 | 10 | 10 | 10 | 10 | 10 | 10 | 10 |
| 37% formalin (g) | 3 | 3 | 3 | 3 | 3 | 3 | 3 | 3 | 3 | 3 | 3 | 3 | 3 |
| NaOH [pH at 25° C.] | 12.8 | 12.8 | 12.8 | 12.8 | 12.8 | 12.8 | 12.8 | 12.8 | 12.8 | 12.8 | 12.8 | 12.8 | 12.8 |
| Ethylenediaminetetracetic acid (g) | 30 | — | — | — | — | 30 | 30 | 30 | 30 | 30 | 30 | 30 | 30 |
| N—Hydroxyethylethylenediaminetriacetic acid (g) | — | 30 | — | — | — | — | — | — | — | — | — | — | — |
| Diethylenetriaminepentacetic acid (g) | — | — | 40 | — | — | — | — | — | — | — | — | — | — |
| 1,2-diaminopropanetetracetic acid (g) | — | — | — | 30 | — | — | — | — | — | — | — | — | — |
| Cyclohexanediaminetetracetic acid (g) | — | — | — | — | 30 | — | — | — | — | — | — | — | — |
| Si (added as sodium metasilicate) (mg) | 75 | 75 | 75 | 75 | 75 | 25 | 300 | — | — | 75 | 75 | 75 | 75 |
| Si (added as sodium orthosilicate) (mg) | — | — | — | — | — | — | — | 75 | — | — | — | — | — |
| Si (added as sodium silicate) (mg) | — | — | — | — | — | — | — | — | 75 | — | — | — | — |
| 30% $H_2O_2$ (g) | — | — | — | — | — | — | — | — | — | 4 | — | — | — |
| Ammonium persulfate (g) | — | — | — | — | — | — | — | — | — | — | 2 | — | — |
| Injected air rate (l/min) | 1 | 1 | 1 | 1 | 1 | 1 | 1 | 1 | 1 | — | — | 1 | 1 |
| Plating temperature (C) | 70 | 70 | 70 | 70 | 70 | 70 | 70 | 70 | 70 | 70 | 70 | 50 | 60 |

| Composition of electroless copper plating solution and plating conditions | Example No. | | | | | |
|---|---|---|---|---|---|---|
| | 14 | 15 | 16 | 17 | 18 | 19 |
| $CuSO_4 \cdot 5H_2O$ (g) | 10 | 10 | 10 | 10 | 5 | 15 |
| 37% formalin (g) | 3 | 3 | 3 | 3 | 3 | 3 |
| NaOH [pH at 25° C.] | 12.8 | 12.8 | 12.8 | 12.8 | 12.8 | 12.8 |
| Ethylenediaminetetracetic acid (g) | 30 | 30 | 30 | 30 | 30 | 30 |
| N—Hydroxyethylethylenediaminetriacetic acid (g) | — | — | — | — | — | — |
| Diethylenetriaminepentacetic acid (g) | — | — | — | — | — | — |
| 1,2-diaminopropanetetracetic acid (g) | — | — | — | — | — | — |
| Cyclohexanediaminetetracetic acid (g) | — | — | — | — | — | — |
| Si (added as sodium metasilicate) (mg) | 75 | 75 | 75 | 75 | 75 | 75 |
| Si (added as sodium orthosilicate) (mg) | — | — | — | — | — | — |
| Si (added as sodium silicate) (mg) | — | — | — | — | — | — |
| 30% $H_2O_2$ (g) | — | — | — | — | — | — |
| Ammonium persulfate (g) | — | — | — | — | — | — |
| Injected air rate (l/min) | 1 | 1 | 5 | 0.1 | 1 | 1 |
| Plating temperature (C) | 75 | 80 | 70 | 70 | 70 | 70 |

Note
Amounts of the respective components added are per liter of the plating solution.

TABLE 2

| Plating characteristics | Example No. | | | | | | | | | | | | | | | | | | |
|---|---|---|---|---|---|---|---|---|---|---|---|---|---|---|---|---|---|---|---|
| | 1 | 2 | 3 | 4 | 5 | 6 | 7 | 8 | 9 | 10 | 11 | 12 | 13 | 14 | 15 | 16 | 17 | 18 | 19 |
| Elongation of the | 5.2 | 9.8 | 5.8 | 4.7 | 3.1 | 3.1 | 3.3 | 4.5 | 6.1 | 3.1 | 3.1 | 3.8 | 4.7 | 6.7 | 8.5 | 4.9 | 5.5 | 4.5 | 6.5 |

TABLE 2-continued

| Plating characteristics | Example No. | | | | | | | | | | | | | | | | | | |
|---|---|---|---|---|---|---|---|---|---|---|---|---|---|---|---|---|---|---|---|
| | 1 | 2 | 3 | 4 | 5 | 6 | 7 | 8 | 9 | 10 | 11 | 12 | 13 | 14 | 15 | 16 | 17 | 18 | 19 |
| deposit (%) Tensile strength of the deposit (kgf/mm$^2$) | 35.8 | 34.1 | 32.5 | 30.1 | 42.5 | 34.4 | 45.2 | 32.2 | 31.8 | 30.2 | 33.1 | 34.2 | 33.2 | 34.9 | 33.1 | 38.5 | 35.5 | 39.2 | 32.4 |
| Stability of plating solution* | | | | | | | | | | | | | | | | | | | |

Note
Evaluation mark for stability of plating solution
○: Very good
○: Slight Cu deposition at the plating tank bottom after the plating
Δ: Considerable Cu deposition at the plating tank bottom after the plating

TABLE 3

| Composition of electroless copper plating solution and plating conditions | Example No. | | | | | | | | | | | | |
|---|---|---|---|---|---|---|---|---|---|---|---|---|---|
| | 21 | 22 | 23 | 24 | 25 | 26 | 27 | 28 | 29 | 30 | 31 | 32 | 33 |
| CuSO$_4$.5H$_2$O (g) | 10 | 10 | 10 | 10 | 10 | 10 | 10 | 10 | 10 | 10 | 10 | 10 | 10 |
| 37% formalin (g) | 3 | 3 | 3 | 3 | 3 | 3 | 3 | 3 | 3 | 3 | 3 | 3 | 3 |
| NaOH [pH at 25° C.] | 12.8 | 12.8 | 12.8 | 12.8 | 12.8 | 12.8 | 12.8 | 12.8 | 12.8 | 12.8 | 12.8 | 12.8 | 12.8 |
| Ethylenediaminetetracetic acid (g) | 30 | — | — | — | — | 30 | 30 | 30 | 30 | 30 | 30 | 30 | 30 |
| N—Hydroxyethylethylenediaminetriacetic acid (g) | — | 30 | — | — | — | — | — | — | — | — | — | — | — |
| Diethylenetriaminepentacetic acid (g) | — | — | 40 | — | — | — | — | — | — | — | — | — | — |
| 1,2-Diaminopropanetetracetic acid (g) | — | — | — | 30 | — | — | — | — | — | — | — | — | — |
| Cyclohexanediaminetetracetic acid (g) | — | — | — | — | 30 | — | — | — | — | — | — | — | — |
| Ge (added as germanium oxide) (mg) | 140 | 140 | 140 | 140 | 140 | 20 | 70 | 350 | — | 140 | 140 | 140 | 140 |
| Ge (added as sodium germanate) (mg) | — | — | — | — | — | — | — | — | 140 | — | — | — | — |
| 30% H$_2$O$_2$ (g) | — | — | — | — | — | — | — | — | — | 4 | — | — | — |
| Ammonium persulfate (g) | — | — | — | — | — | — | — | — | — | — | 2 | — | — |
| Injected air rate (l/min) | 1 | 1 | 1 | 1 | 1 | 1 | 1 | 1 | 1 | — | — | 1 | 1 |
| Plating temperature (°C.) | 70 | 70 | 70 | 70 | 70 | 70 | 70 | 70 | 70 | 70 | 70 | 50 | 60 |

| Composition of electroless copper plating solution and plating conditions | Example No. | | | | | |
|---|---|---|---|---|---|---|
| | 34 | 35 | 36 | 37 | 38 | 39 |
| CuSO$_4$.5H$_2$O (g) | 10 | 10 | 10 | 10 | 5 | 15 |
| 37% formalin (g) | 3 | 3 | 3 | 3 | 3 | 3 |
| NaOH [pH at 25° C.] | 12.8 | 12.8 | 12.8 | 12.8 | 12.8 | 12.8 |
| Ethylenediaminetetracetic acid (g) | 30 | 30 | 30 | 30 | 30 | 30 |
| N—Hydroxyethylethylenediaminetriacetic acid (g) | — | — | — | — | — | — |
| Diethylenetriaminepentacetic acid (g) | — | — | — | — | — | — |
| 1,2-Diaminopropanetetracetic acid (g) | — | — | — | — | — | — |
| Cyclohexanediaminetetracetic acid (g) | — | — | — | — | — | — |
| Ge (added as germanium oxide) (mg) | 140 | 140 | 140 | 140 | 140 | 140 |
| Ge (added as sodium germanate) (mg) | — | — | — | — | — | — |
| 30% H$_2$O$_2$ (g) | — | — | — | — | — | — |
| Ammonium persulfate (g) | — | — | — | — | — | — |
| Injected air rate (l/min) | 1 | 1 | 5 | 0.1 | 1 | 1 |
| Plating temperature (°C.) | 75 | 80 | 70 | 70 | 70 | 70 |

Note
Amounts of the respective components added are per liter of the plating solution.

TABLE 4

| Plating characteristics | Example No. | | | | | | | | | | | | | | | | | | |
|---|---|---|---|---|---|---|---|---|---|---|---|---|---|---|---|---|---|---|---|
| | 21 | 22 | 23 | 24 | 25 | 26 | 27 | 28 | 29 | 30 | 31 | 32 | 33 | 34 | 35 | 36 | 37 | 38 | 39 |
| Elongation of the deposit (%) | 8.2 | 9.0 | 4.3 | 8.5 | 5.2 | 4.0 | 7.2 | 8.2 | 8.5 | 3.7 | 3.5 | 4.1 | 5.3 | 9.6 | 11.5 | 7.5 | 7.8 | 9.3 | 6.2 |
| Tensile strength of the deposit (kgf/mm$^2$) | 39.0 | 34.5 | 38.2 | 28.1 | 34.8 | 29.0 | 29.7 | 39.0 | 37.6 | 36.1 | 38.9 | 35.4 | 36.2 | 38.4 | 35.2 | 40.3 | 37.5 | 36.5 | 41.3 |
| Stability of plating | | | | | | | | | | | | | | | | | | | |

TABLE 4-continued

| Plating character- | Example No. | | | | | | | | | | | | | | | | | | |
|---|---|---|---|---|---|---|---|---|---|---|---|---|---|---|---|---|---|---|---|
| istics | 21 | 22 | 23 | 24 | 25 | 26 | 27 | 28 | 29 | 30 | 31 | 32 | 33 | 34 | 35 | 36 | 37 | 38 | 39 |
| solution* | | | | | | | | | | | | | | | | | | | |

Note
Evaluation mark for stability of plating solution:
○: very good
○: Slight Cu deposition at the plating tank bottom after the plating
△: Considerable Cu deposition at the plating tank bottom after the plating

TABLE 5

| Composition of electroless copper plating solution and plating conditions | Comparative Example No. | | | | | | | | | | | | |
|---|---|---|---|---|---|---|---|---|---|---|---|---|---|
| | 1 | 2 | 3 | 4 | 5 | 6 | 7 | 8 | 9 | 10 | 11 | 12 | 13 |
| $CuSO_4.5H_2O$ (g) | 10 | 10 | 10 | 10 | 10 | 10 | 10 | 10 | 10 | 10 | 10 | 10 | 10 |
| 37% formalin (g) | 3 | 3 | 3 | 3 | 3 | 3 | 3 | 3 | 3 | 3 | 3 | 3 | 3 |
| NaOH [pH at 25° C.] | 12.8 | 12.8 | 12.8 | 12.8 | 12.8 | 12.8 | 12.8 | 12.8 | 12.8 | 12.8 | 12.8 | 12.8 | 12.8 |
| Ethylenediaminetetracetic acid (g) | 30 | — | — | — | — | 30 | — | — | — | — | 30 | — | — |
| N—Hydroxyethylenediaminetriacetic acid (g) | — | 30 | — | — | — | — | 30 | — | — | — | — | 30 | — |
| Diethylenetriaminepentacetic acid (g) | — | — | 40 | — | — | — | — | 40 | — | — | — | — | 40 |
| 1,2-Diaminopropanetetracetic acid (g) | — | — | — | 30 | — | — | — | — | 30 | — | — | — | — |
| Cyclohexanediaminetretracetic acid (g) | — | — | — | — | 30 | — | — | — | — | 30 | — | — | — |
| Ge (added as gerumanium oxide) (mg) | — | — | — | — | — | 140 | 140 | 140 | 140 | 140 | — | — | — |
| Si (added as sodium metasilicate) (mg) | 75 | 75 | 75 | 75 | 75 | — | — | — | — | — | — | — | — |
| 30% $H_2O_2$ (g) | — | — | — | — | — | — | — | — | — | — | — | — | — |
| Ammonium persulfate (g) | — | — | — | — | — | — | — | — | — | — | — | — | — |
| Injected air rate (l/min) | — | — | — | — | — | — | — | — | — | — | 1 | 1 | 1 |
| Plating temperature (°C.) | 70 | 70 | 70 | 70 | 70 | 70 | 70 | 70 | 70 | 70 | 70 | 70 | 70 |

| Composition of electroless copper plating solution and plating conditions | Comparative Example No. | | | | | |
|---|---|---|---|---|---|---|
| | 14 | 15 | 16 | 17 | 18 | 19 |
| $CuSO_4.5H_2O$ (g) | 10 | 10 | 10 | 10 | 10 | 10 |
| 37% formalin (g) | 3 | 3 | 3 | 3 | 3 | 3 |
| NaOH [pH at 25° C.] | 12.8 | 12.8 | 12.8 | 12.8 | 12.8 | 12.8 |
| Ethylenediaminetetracetic acid (g) | — | — | 30 | 30 | 30 | 30 |
| N—Hydroxyethylenediaminetriacetic acid (g) | — | — | — | — | — | — |
| Diethylenetriaminepentacetic acid (g) | — | — | — | — | — | — |
| 1,2-Diaminopropanetetracetic acid (g) | 30 | — | — | — | — | — |
| Cyclohexanediaminetretracetic acid (g) | — | 30 | — | — | — | — |
| Ge (added as gerumanium oxide) (mg) | — | — | — | — | — | — |
| Si (added as sodium metasilicate) (mg) | — | — | 75 | — | — | — |
| 30% $H_2O_2$ (g) | — | — | — | — | 4 | — |
| Ammonium persulfate (g) | — | — | — | — | — | — |
| Injected air rate (l/min) | 1 | 1 | — | 1 | — | — |
| Plating temperature (°C.) | 70 | 70 | 50 | 50 | 70 | 70 |

Note
Amounts of the respective components added are per liter of the plating solution.

TABLE 6

| Plating character-istics | Comparative Example No. | | | | | | | | | | | | | | | | | | |
|---|---|---|---|---|---|---|---|---|---|---|---|---|---|---|---|---|---|---|---|
| | 1 | 2 | 3 | 4 | 5 | 6 | 7 | 8 | 9 | 10 | 11 | 12 | 13 | 14 | 15 | 16 | 17 | 18 | 19 |
| Elongation of the deposit (%) | 1.5 | —** | 1.2 | 1.1 | 1.0 | 1.8 | —** | 1.3 | 0.8 | 0.9 | less than 0.5 | 0.7 | 0.6 | less than 0.5 | less than 0.5 | 0.9 | less than 0.5 | less than 0.5 | —** |
| Tensile strength of the deposit (Kgf/mm²) | 22.1 | —** | 18.7 | 15.7 | 12.6 | 20.2 | —** | 14.9 | 17.3 | 15.8 | less than 5 | 8.5 | 7.9 | less than 5 | less than 5 | 7.8 | less than 5 | less than 5 | —** |
| Stability of plating solution* | △ | x | △ | △ | △ | △ | x | △ | △ | △ | △ | △ | | △ | | | | | x |

Note
Evaluation mark for stability of plating solution:
○: very good
○: Slight Cu deposition at the plating tank bottom after the plating.
△: Considerable Cu deposition at the plating tank bottom after the plating.
x: Decomposed during the plating.
**impossible to measure As is obvious from the results of Examples and Comparative Examples, a plating film having distinguished mechanical properties can be obtained according to the present process for electroless copper plating, and the stability of the present electroless copper plating solution can be kept better and substantially thick plating can be carried out.

In the present process, a second additive can be added to the present electroless copper plating solution, for example, when it is required to keep far better stability of the electroless copper plating solution, potassium iodide, etc. can be added thereto.

What is claimed is:

1. A process for electroless copper plating in an electroless copper plating solution containing a copper salt, a complexing agent for the copper salt, a reducing agent for the copper salt, and a pH-adjusting agent, which comprises adding at least one of soluble inorganic silicon compounds and soluble inorganic germanium compounds as an additive to the electroless copper plating solution and conducting electroless copper plating by injecting an oxygen-containing gas into the plating solution or by adding an oxidizing agent to the plating solution or by both injection of the oxygen-containing gas and addition of the oxidizing agent.

2. A process according to claim 1, where the additive is added in an amount of 10 mg/l to 1 g/l in terms of silicon atom or germanium atom.

3. A process according to claim 1, wherein the soluble inorganic silicon compound is at least one of water glass, sodium metasilicate, sodium orthosilicate, sodium silicate, potassium silicate, lithium silicate, sodium polysilicate, silicon dioxide, and a silicon-containing gas.

4. A process according to claim 1, wherein the soluble inorganic germanium compound is at least one of sodium germanate, potassium germanate, lithium germanate, germanium dioxide, germanium chloride, germanium sulfate, and germanium nitrate.

5. A process according to claim 1, wherein the oxygen-containing gas is air.

6. A process according to claim 5, wherein the air is injected into the plating solution in a rate of at least 0.01 l/min per liter of the plating solution.

7. A process according to claim 6, wherein the air is injected into the plating solution at a rate of 1 to 5 l/min per liter of the plating solution.

8. A process according to claim 1, wherein the oxidizing agent is hydrogen peroxide or a persulfate.

9. A process according to claim 8, wherein the persulfate is potassium persulfate, sodium persulfate or ammonium persulfate.

10. A process according to claim 1, wherein the oxidizing agent is added to the plating solution in an amount of at least 0.5 g/l.

11. A process according to claim 1, wherein the electroless copper plating is carried out at a temperature of at least 40° C.

12. A process according to claim 1, wherein the complexing agent has a chemical structure of $>N-C-C-N<$.

13. A process according to claim 12, wherein the complexing agent is ethylenediaminetetracetic acid, N-hydroxyethylethylenediaminetriacetic acid, 1,2-diaminopropanetetracetic acid, diethylenetriaminepentacetic acid or cyclohexanediaminetetracetic acid.

14. A process for electroless copper plating in an electroless copper plating solution containing a copper salt, a complexing agent for the copper salt, a reducing agent for the copper salt, and a pH-adjusting agent, which comprises adding at least one additive selected from the group consisting of a soluble inorganic silicon compound and a soluble inorganic germanium compound to the plating solution, introducing an oxidizing medium into the plating solution and conducting electroless copper plating.

15. A process according to claim 14, wherein the oxidizing medium is an oxygen-containing gas.

16. A process according to claim 15, wherein the oxygen-containing gas is introduced while conducting electroless copper plating.

17. A process according to claim 15, wherein the oxidizing medium is an oxidizing agent selected from the group consisting of hydrogen peroxide and a persulfate.

18. A process according to claim 17, wherein the persulfate is selected from the group consisting of potassium persulfate, sodium persulfate and ammonium persulfate.

19. A process according to claim 17, wherein the oxidizing agent is added to the plating solution in an amount of at least 0.5 g/l.

20. A process according to claim 14, wherein the electroless copper plating is carried out at a temperature of at least 40° C.

21. A process according to claim 14, wherein the complexing agent has a chemical structure of $>N-C-C-N<$.

22. A process according to claim 21, wherein the complexing agent is selected from the group consisting of ethylenediaminetetracetic acid, N-hydroxyethylethylenediaminetriacetic acid, 1,2-diaminopropanetetracetic acid, diethylenetriaminepentacetic acid and cyclohexanediaminetetracetic acid.

23. A process according to claim 14, wherein the additive is added in an amount of 10 mg/l to 1 g/l in terms of silicon atom or germanium atom.

24. A process according to claim 14, wherein the additive is at least one soluble inorganuc silicon compound selected from the group consisting of water glass, sodium metasilicate, sodium orthosilicate, sodium silicate, potassium silicate, lithium silicate, sodium polysilicate, silicon dioxide, and a silicon-containing gas.

25. A process according to claim 14, wherein the additive is at least one soluble inorganic germanium compound selected from the group consisting of sodium germanate, potassium germanate, lithium germanate, germanium dioxide, germanium chloride, germanium sulfate, and germanium nitrate.

26. A process according to claim 15, wherein the oxygen-containing gas is air.

27. A process according to claim 26, wherein the air is injected into the plating solution while conducting electroless copper plating at a rate of at least 0.01 l/min per liter of the plating solution.

28. A process according to claim 26, wherein the air is injected into the plating solution while conducting electroless copper plating at a rate of 1 to 5 l/min per liter of the plating solution.

29. A process according to claim 14, wherein the additive is at least one soluble inorganic silicon compound selected from the group consisting of water glass, sodium metasilicate, sodium orthosilicate, sodium silicate, potassium silicate, lithium silicate, sodium polysilicate, silicon dioxide, and silicon-containing gas and at least one soluble inorganic germanium compound selected from the group consisting of sodium germanate, potassium germanate, lithium germanate, germanium dioxide, germanium chloride, germanium sulfate, and germanium nitrate.

30. A process according to claim 17, wherein the oxidizing agent is introduced prior to conducting electroless copper plating.

31. A process according to claim 14, wherein the oxidizing medium is both an oxygen-containing gas and an oxidizing agent selected from the group consisting of hydrogen peroxide and a persulfate.

* * * * *